United States Patent
Akhter et al.

(10) Patent No.: US 9,218,889 B1
(45) Date of Patent: Dec. 22, 2015

(54) MULTIBIT SENSE AMPLIFIER CALIBRATION

(71) Applicants: Tahmina Akhter, Austin, TX (US);
Gilles J. Muller, Austin, TX (US);
Ronald J. Syzdek, Austin, TX (US)

(72) Inventors: Tahmina Akhter, Austin, TX (US);
Gilles J. Muller, Austin, TX (US);
Ronald J. Syzdek, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/478,320

(22) Filed: Sep. 5, 2014

(51) Int. Cl.
*G11C 16/06* (2006.01)
*G11C 16/28* (2006.01)

(52) U.S. Cl.
CPC .................................. *G11C 16/28* (2013.01)

(58) Field of Classification Search
CPC ..... G11C 16/18; G11C 16/26; G11C 11/5642
USPC .................. 365/185.21, 185.2, 207
See application file for complete search history.

(56) References Cited

U.S. PATENT DOCUMENTS

| | | | |
|---|---|---|---|
| 5,991,219 A | 11/1999 | Nakashima | |
| 6,459,620 B1 | 10/2002 | Eshel | |
| 7,123,514 B2 | 10/2006 | Watanabe | |
| 7,649,781 B2 | 1/2010 | Syzdek et al. | |
| 2013/0148432 A1 | 6/2013 | Castillon et al. | |
| 2013/0182507 A1* | 7/2013 | Marko et al. | 365/185.21 |
| 2014/0321195 A1* | 10/2014 | Antonyan | 365/148 |

FOREIGN PATENT DOCUMENTS

WO    2013148361 A1    10/2013

OTHER PUBLICATIONS

Han, Session 12 Overview: Non-volatile memory solutions, Solid State Circuits Conference Digest of Technical Papers (ISSCC), 2013 IEEE International, Feb. 14, 2013, 242 pages (slides).

* cited by examiner

*Primary Examiner* — Huan Hoang (57) ABSTRACT

A circuit includes a non-volatile memory, a calibration circuit, and a sense amplifier. The sense amplifier senses a state of a memory cell during sensing. The sense amplifier includes a differential circuit having a first input coupled to a reference current source, a second input, and an output coupled to the calibration circuit during a calibration mode. A calibration current source is configured to be coupled to the second input of the differential current sensing circuit during the calibration mode and decoupled from the second input during the sensing mode. A variable current source is coupled to the differential current sensing circuit and the calibration circuit. The calibration circuit tests a plurality of currents of the variable current source during the calibration mode and selects one of the plurality of currents. The sense amplifier senses using the selected one of the plurality of currents.

20 Claims, 7 Drawing Sheets

MULTIBIT SENSE AMPLIFIER CALIBRATION

BACKGROUND

1. Field

This disclosure relates generally to sense amplifiers, and more specifically, to calibration of sense amplifiers.

2. Related Art

Many integrated circuit devices include memory devices to store data, such as memory cells, with each memory cell storing a bit of data. Sense amplifiers are used to read the value of data stored at each memory cell. However, the sensing precision of a sense amplifier may be affected due to device mismatch within the sense amplifier, as well as between components of an integrated circuit device.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Figure 1:
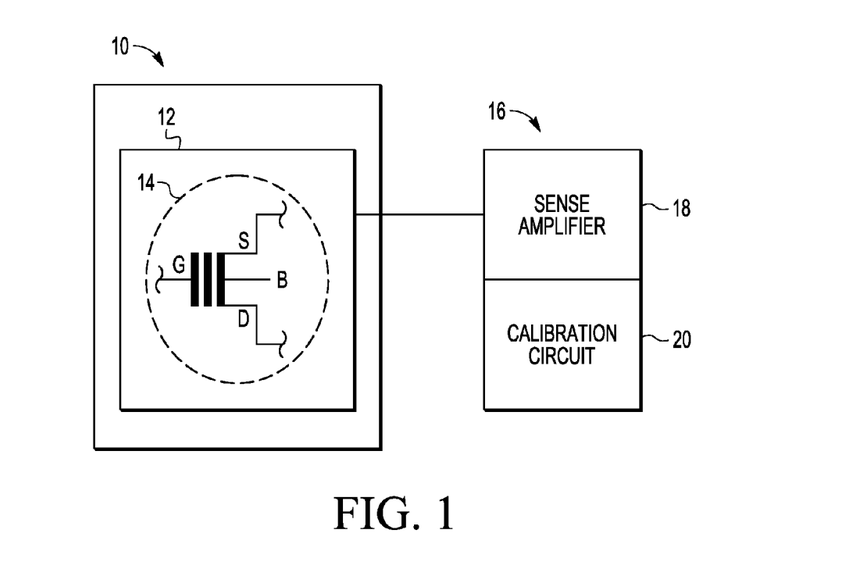
FIG. 1 illustrates a block diagram depicting an example sensing system in which the present disclosure is implemented, according to some embodiments.

FIG. 1 illustrates a block diagram depicting an example sensing system 16 in which the present disclosure is implemented. Sensing system 16 is coupled to a non-volatile memory (NVM) array 10 that includes a plurality of NVM memory cells 12 (also referred to as a memory array 10 that includes a plurality of memory cells 12). Non-volatile memory (NVM) memory cell 14 (also referred to as a memory cell) represents one of the plurality of memory cells 12. Each memory cell 14 has two current electrodes, such as a drain (D) electrode and a source (S) electrode, a gate (G) electrode, and a body (B) node. Depending upon the operation (e.g., read operation, program operation, erase operation) to be performed on the plurality of memory cells 12, different body, source, drain, and gate bias voltages (VB, VS, VD, VG) are respectively applied to the body (B) nodes, source (S) electrodes, drain (D) electrodes, and gate (G) electrodes for selected ones of memory cells 12.

For the embodiment depicted, memory cell 14 is a floating gate type NVM memory cell. For a floating gate type NVM memory cell, a control gate, a dielectric layer, a floating gate, and a tunnel dielectric layer will typically be located below the gate (G) electrode and above the channel region within the semiconductor substrate upon which the floating gate memory cell is fabricated. It is noted that other NVM memory cell types could also be utilized, such as split-gate NVM memory cells, multi-level NVM memory cells, and/or other types of NVM memory cells, if desired. It is also noted that NVM array 10 can be integrated within a single integrated circuit with one or more processors, can be implemented as a stand-alone memory integrated circuit, or can be implemented in another desired configuration, as desired.

Sensing system 16 includes a plurality of sense amplifier circuits 18 and a plurality of calibration circuits 20. Each memory cell 14 of the plurality of memory cells 12 is coupled to a sense amplifier circuit 18 that in turn is coupled to a calibration circuit 20. Sense amplifier circuit 18 is configured to read the value of data stored at a given memory cell 14 in memory array 10, as further discussed below in connection with FIG. 2. Calibration circuit 20 is configured to calibrate the sense amplifier circuit 18, and is further discussed below in connection with FIG. 5.

Figure 2:
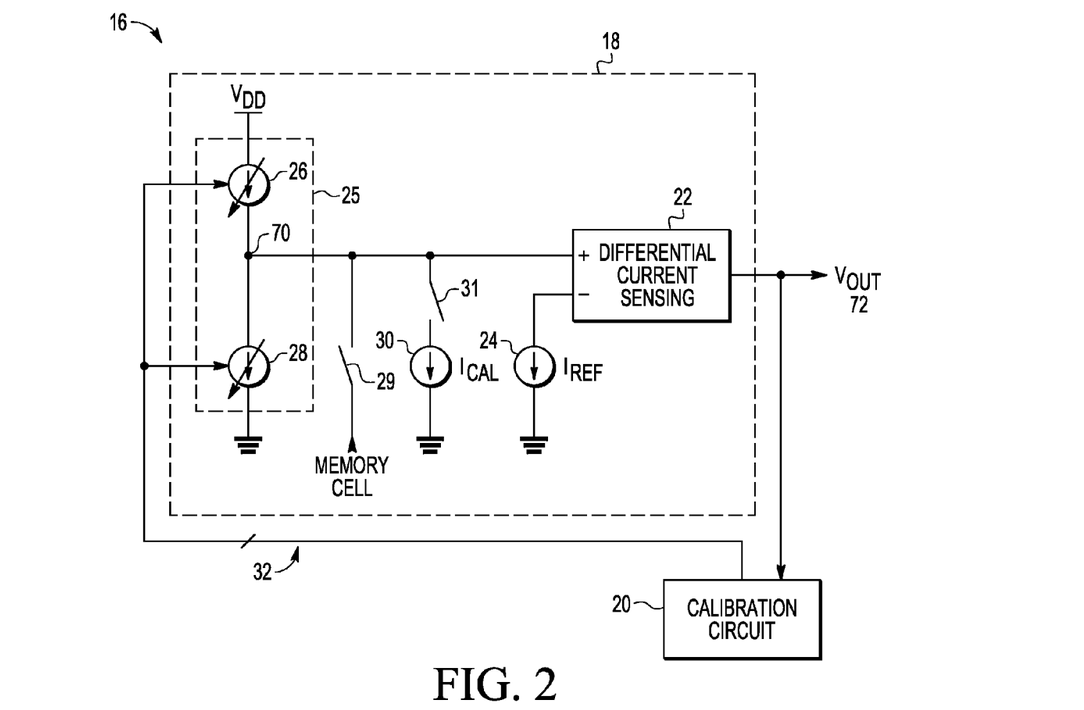
FIG. 2 illustrates a block diagram depicting an example sense amplifier circuit in which the present disclosure is implemented, according to some embodiments.

FIG. 2 illustrates a block diagram depicting an example sense amplifier circuit 18 in sensing system 16 for a given memory cell. Sense amplifier circuit 18 includes a reference current (IREF) source 24, a calibration current (ICAL) source 30, a variable current (IVAR) source 25, a differential current sensing circuit 22, and switches 29 and 31. IREF source 24 is configured to provide a reference current IREF, ICAL source 30 is configured to provide a calibration current ICAL, and IVAR source 25 is configured to provide a variable current IVAR (e.g., a current that is selected from among a plurality of different currents). Each IREF source 24 in the plurality of sense amplifier circuits 18 in sensing system 16 provides a same (global) current IREF, and each ICAL source 30 in the plurality of sense amplifier circuits 18 provides a same (global) current ICAL. Each IVAR source 25 in the plurality of sense amplifier circuits 18 provides a same (global) plurality of different currents, as further discussed below.

Differential current sensing circuit 22 (or more simply a DCS circuit 22) is configured to compare a current at one input terminal (such as a non-inverting (+) input terminal) with a current at another input terminal (such as an inverting (−) input terminal) and to output a voltage VOUT 72 based on the comparison. IVAR source 25 produces the variable current at node 70, which is provided to a first input terminal (e.g., a non-inverting input terminal) of DCS circuit 22. IVAR source 25 includes an additive variable current source 26 (discussed in connection with FIG. 3) and a subtractive variable current source 28 (discussed in connection with FIG. 4). A first terminal of the additive variable current source 26 is connected to a positive power supply terminal and a second terminal of the additive variable current source 26 is connected to node 70, which is connected to the first input terminal of DCS circuit 22. A first terminal of the subtractive variable current source 28 is connected to node 70 and a second terminal of the subtractive variable current source 28 is connected to a negative power supply terminal. The positive power supply terminal provides an appropriate voltage, such as a positive voltage value (e.g., VDD), to drive various components in the sensing system 16. The negative power supply terminal provides an appropriate voltage that is less than the positive power supply voltage, such as zero (e.g., ground) or a negative voltage value.

A first terminal of ICAL source 30 is also connected to the first input terminal of DCS circuit 22 via switch 31 and a second terminal of ICAL source 30 is connected to the negative power supply terminal. A first current electrode of a selected memory cell 14 is also connected to the first input terminal of DCS circuit 22 via switch 29. A first terminal of IREF source 24 is connected to a second input terminal (e.g., an inverting input terminal) of DCS circuit 22 and a second terminal of IREF source 24 is connected to the negative power supply terminal. A control terminal of switch 29 and switch 31 are also coupled to control logic (not shown) that controls when the ICAL source 30 is coupled to the first input terminal of DCS circuit 22 (also referred to as enabling/disabling the ICAL path) and when the memory cell is coupled to the first input terminal of DCS circuit (also referred to as enabling/disabling the ICELL path).

The output VOUT 72 of sense amplifier circuit 18 is connected as an input to calibration circuit 20. Calibration circuit 20 is configured to use VOUT 72 to generate an output of enable signals 32 that control variable current sources 26 and 28 to produce the variable current at node 70. The enable signals 32 of calibration circuit 20 are connected as input to the variable current sources 26 and 28 of IVAR source 25. The generation of enable signals 32 is further discussed in connection with FIG. 5.

Ignoring IVAR source 25 and calibration circuit 20 for the moment, DCS circuit 22 is configured to read the value of data stored at a selected memory cell 14 during a sensing mode, which represents a stored logic state of the memory cell 14. During sensing mode, switch 29 is closed and completes the connection between the first current electrode of memory cell 14 and the first input terminal of DCS circuit 22, and switch 31 is open and decouples ICAL source 30 from the first input terminal of DCS circuit 22.

During sensing mode, a read voltage is applied to gate (G) electrode of memory cell 14 and a reference voltage (such as VDD) is applied to a second current electrode of the selected memory cell 14, where memory cell 14 generates a responsive current that represents a logic state of the memory cell 14. The responsive current, or memory cell current (ICELL), is received at the first input terminal of DCS circuit 22 via the memory cell's first current electrode and is compared with the reference current (IREF) received at the second input terminal of DCS circuit 22 to determine the present logic state of the memory cell 14. ICELL is expected to have either a low level of current that represents a first logic state or a high level of current that represents a second logic state. In one example, the memory cell 14 provides an ICELL of 4 microamps (uA) or less to represent a first stored logic state of "0" (indicating the memory cell is programmed) and provides an ICELL of 10 uA or more to represent a second stored logic state of "1" (indicating the memory cell is erased).

DCS circuit 22 has a trip point based on the reference current IREF, where IREF is configured to have a value between the expected levels of CELL. The output signal VOUT 72 changes at the trip point to indicate the logic state being stored by the memory cell 14. Generally, DCS circuit 22 has two circuit branches, a first branch coupled to the first input terminal of DCS circuit 22 and ideally passing ICELL, and a second branch coupled to the second input terminal of DCS circuit 22 and ideally passing IREF. If the current passed in the ICELL branch is less than the current passed in the IREF branch, DCS circuit 22 returns a first signal indicating the memory cell is in the first logic state (e.g., the memory cell current is sensed below the trip point). If the current passed in the ICELL branch is greater than the current passed in the IREF branch, DCS circuit 22 returns a second signal indicating the memory cell is in the second logic state (e.g., the memory cell current is sensed above the trip point).

However, the sensing precision of DCS circuit 22 may be affected due to device mismatch of the DCS circuit, such as due to operational mismatch between the differential pair of transistors of the DCS circuit's branches. This mismatch may cause various leakage currents that affect one or both of the "sensed" values of the memory cell current ICELL and the reference current IREF that are passed through the two branches, which in turn moves or skews the DCS circuit's trip point away from the expected trip point of the applied value of IREF. The skewed trip point causes the DCS circuit to return erroneous logic states due to tripping too "early" or too "late."

The present disclosure provides embodiments of a method and circuit for independently trimming each DCS circuit 22 in sensing system 16 by introducing additive or subtractive variable current IVAR to DCS circuit 22 to compensate for the effects of leakage current local to DCS circuit 22. During a calibration mode, switch 29 is open and decouples memory cell 14 from the first input terminal of DCS circuit 22, and switch 31 is closed and completes the connection between ICAL source 30 and the first input terminal of DCS circuit 22. A current offset is determined for each DCS circuit 22 in sensing system 16 by globally setting ICAL source 30 and IREF source 24 to apply a same amount or magnitude of current to the first and second input terminals of each DCS circuit 22, respectively. A (local) current offset is measured for each DCS circuit 22 as the difference between the sensed current values flowing across the two branches of DCS circuit 22. The current offset measured between the two branches takes into account the various unmatched leakage currents that affect both currents applied at the first and second input terminals of a given DCS circuit, which ultimately affect the DCS circuit's trip point. The values of the plurality of currents provided by IVAR source 25 are then (globally) set based on the size of the largest current offset of the current offsets and are made available to each DCS circuit 22 in sensing system 16, as further discussed below in connection with FIGS. 3 and 4.

For example, a same current value is applied as IREF and ICAL (e.g., 7 uA), which may be affected by some leakage current within the DCS circuit. A positive current offset (e.g., +4 uA) is measured as the current difference between the branches of DCS circuit, where the current passed through the IREF branch is greater than the current passed through the ICAL branch by the current offset. The DCS circuit's trip point is skewed from the expected trip point at IREF by the positive current offset (e.g., 11 uA). The DCS circuit's raised trip point may cause the DCS circuit to trip "late" while reading a memory cell in the second or erased logic state (e.g., ICELL is 10 uA) when ICELL is less than the DCS circuit's raised trip point, erroneously indicating the memory cell is in the first or programmed logic state (e.g., DCS circuit does not trip when ICELL is 10 uA because DCS circuit's trip point is 11 uA, but DCS circuit should trip because the applied value of ICELL is greater than the applied value of IREF of 7 uA).

In another example, a negative current offset (e.g., −4 uA) is measured as the current difference between the branches of DCS circuit, where the current passed through the IREF branch is less than the current passed through the ICAL branch by the current offset. The DCS circuit's trip point is skewed from the expected trip point at IREF by the negative current offset (e.g., 3 uA). The DCS circuit's lowered trip point may cause the DCS circuit to trip "early" while reading a memory cell in the first or programmed logic state (e.g., ICELL is 4 uA) when ICELL is greater than the DCS circuit's lowered trip point, erroneously indicating the memory cell is in the second or erased logic state (e.g., DCS circuit trips when ICELL is 4 uA because DCS circuit's trip point is 3 uA, but DCS circuit should not trip because the applied value of ICELL is less than the applied value of IREF of 7 uA).

Determining the largest current offset need only be performed once (e.g., during a design phase to set the plurality of currents provided by IVAR source 25), while calibration of the plurality of DCS circuits may be repeated as often as needed (e.g., during a runtime phase), which is further described below. Also, once values of the plurality of currents are set, the plurality of current offsets determined for the plurality of DCS circuits need not be recorded or maintained. Calibration mode is designed to calibrate each DCS circuit to compensate for an unknown (local) current offset, where the unknown current offset is equal to or less than the largest current offset. Calibration mode is triggered periodically (e.g., implemented after expiration of some recurring period of time), at start-up of the sensing system 16, or on an as-needed basis.

Once the values of the plurality of currents provided by IVAR source 25 are set, ICAL source 30 is (continued to be) globally set to the same value as IREF source 24. During calibration mode, each of the plurality of calibration circuits 20 reads the output of (local) DCS circuit 22. Although both input terminals of DCS circuit 22 receive the same applied amount of current, the (local) current offset causes each DCS circuit 22 to output a signal VOUT 72 that indicates either a high or a low logic state, which in turn indicates whether the DCS circuit is tripping early (e.g., outputs high logic state signal) or late (e.g., outputs low logic state signal). Based on the DCS circuit output, calibration circuit 20 controls (local) IVAR source 25 to produce a selected IVAR current (e.g., a current selected from the plurality of currents) to compensate for the (local) current offset. Each calibration circuit 20 in sensing system 16 individually performs the selection (e.g., each calibration circuit 20 selects an IVAR current based on the local DCS circuit output, independently of the other calibration circuits). In one embodiment, the plurality of calibration circuits 20 performs the selection in parallel. The selected IVAR current is summed with the applied value of ICAL current at the first input terminal of DCS circuit 22 to compensate for the current offset affecting the trip point of DCS circuit 22 and effectively "moves" the trip point closer to IREF. In other words, calibration circuit 20 uses the selected IVAR current to match the current sensed at the first branch (e.g., ICAL+IVAR, where IVAR is additive or subtractive) with the current sensed at the second branch (e.g., IREF), which reduces the current offset that skews the trip point and thereby improves sensing precision of DCS circuit 22. Calibration circuit 20 is further discussed below in connection with FIG. 5.

In one example, DCS circuit 22 has a "late" trip point (e.g., 11 uA) due to a positive current offset (e.g., +4 uA), where the current passed through the IREF branch is greater than the current passed through the ICAL branch. In such an example, IVAR is an additive current that raises ICAL to reduce the positive current offset measured between the branches (e.g., total IVAR of +4 uA, which eliminates positive current offset and moves trip point to IREF of 7 uA). In another example, DCS circuit 22 has an "early" trip point (e.g., 3 uA) due to a negative current offset (e.g., −4 uA), where the current passed through the IREF branch is less than the current passed through the ICAL branch. In such an example, IVAR is a subtractive current that lowers ICAL to reduce the negative current offset measured between the branches (e.g., IVAR of −4 uA, which eliminates negative current offset and moves trip point to IREF of 7 uA).

Calibration mode of the sensing system 16 includes multi-bit calibration (also referred to as N-bit trim), where the above-discussed calibration process is performed for a maximum of N times, N being an integer value of one or greater. It is noted that the use of capital letter N throughout the present disclosure refers to the same integer value of one or greater. Each calibration circuit 20 and sense amplifier circuit 18 includes circuitry that implements N iterations of the calibration process. Each iteration of the calibration process controls the amount of IVAR current applied to the first input terminal to reduce the current offset, as further discussed below.

Although the calibration and sense amplifier circuits are capable of performing N iterations, fewer than N iterations may be selected. A bit mode select value is used to select a particular value of N that specifies a requested bit trim mode, the bit mode select value being an integer value in the range of one through N (inclusive). Calibration circuit 20 iterates through each bit trim mode until the requested bit trim mode is performed, thus performing the specified number of iterations during calibration mode. For example, calibration circuit 20 is configured to perform 3-bit trim mode (N=3) and receives a bit mode select value having a value of 2, indicating that a 2-bit trim mode is requested (or that 2 iterations of the calibration process are requested), although calibration and sense amplifier circuits are capable of performing 3 iterations.

Calibration circuit 20 is configured to implement a one-bit trim mode by performing a first test of DCS circuit 22 (or reads the output of DCS circuit 22) and controlling IVAR source 25 to produce a first IVAR current (e.g., a first current selected from the plurality of currents) to be introduced at the first input terminal of DCS circuit 22 based on the result of the first test. Calibration circuit 20 is also configured to implement a two-bit trim mode by performing a second test (or read) of DCS circuit 22 after the first IVAR current is introduced at the DCS circuit. Based on the second test result, calibration circuit 20 further controls (local) IVAR source 25 to produce a second IVAR current (e.g., a second current selected from the plurality of currents) to additionally compensate for the (local) current offset. Calibration circuit 20 is also configured to implement a next bit trim mode by again performing a test of DCS circuit after the previous IVAR current is introduced at DCS circuit and controlling another IVAR current to be introduced at the DCS circuit to further reduce the current offset. In some embodiments, calibration circuit 20 may also complete fewer than the selected number of iterations if a test result indicates that DCS circuit 22 does not need additional calibration (e.g., if the DCS circuit output flips, as further discussed below). In this manner, calibration circuit 20 gradually and precisely minimizes the current offset. A multibit calibration process is further discussed below in connection with FIG. 6.

Once the total selected IVAR current (or the summed IVAR current of the different IVAR currents selected during multi-bit calibration) is determined, calibration mode is complete and the total selected IVAR current is continuously applied during the sensing mode of DCS circuit 22 in order to adjust ICELL current in the same manner to reduce the current offset. During sensing mode, ICAL source 30 is disconnected from the first input terminal of DCS circuit 22 via open switch 31, ICELL current is connected to the first input terminal via closed switch 29, and IVAR current source 25 providing the (additive or subtractive) IVAR current is still connected to the first input terminal. The IVAR current continues to reduce the current offset between the two branches of DCS circuit 22 and effectively moves the DCS circuit's trip point closer to the applied value of IREF (e.g., the example early trip point occurred at 3 uA, which moved to 7 uA; the example late trip point occurred at 11 uA, which moved to 7 uA). Trip point calibration is further discussed below in connection with FIG. 7. Additionally, by calibrating the trip points of DCS circuits 22 in sensing system 16, the memory cell threshold voltage window can be minimized (due to degradation from exposure to program/erase cycles or due to memory cell design choice) without affecting sensing accuracy. Similarly, read access time can be improved due to calibration. The resulting effects of trip point calibration are further discussed below in connection with FIGS. 8 and 9.

Figure 3:
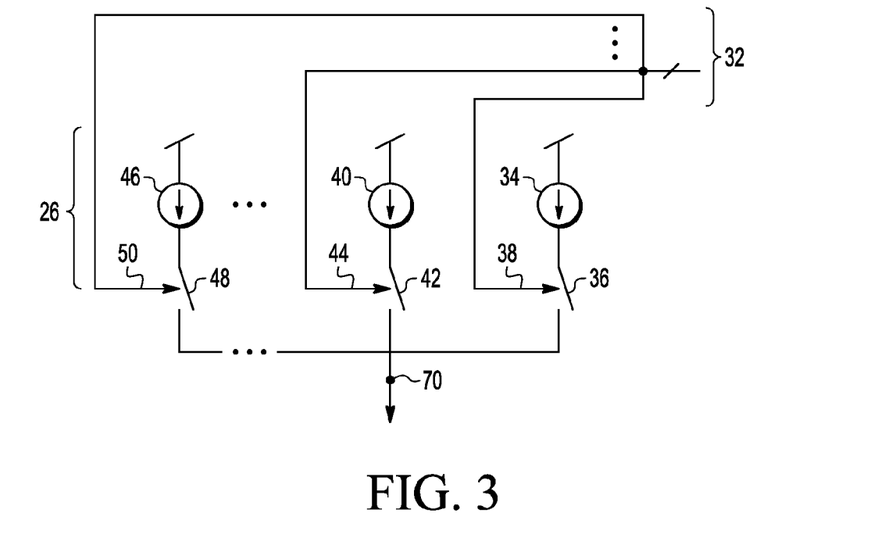
FIGS. 3 and 4 illustrate block diagrams depicting example variable current sources utilized in sensing system in which the present disclosure is implemented, according to some embodiments.
Figure 4:
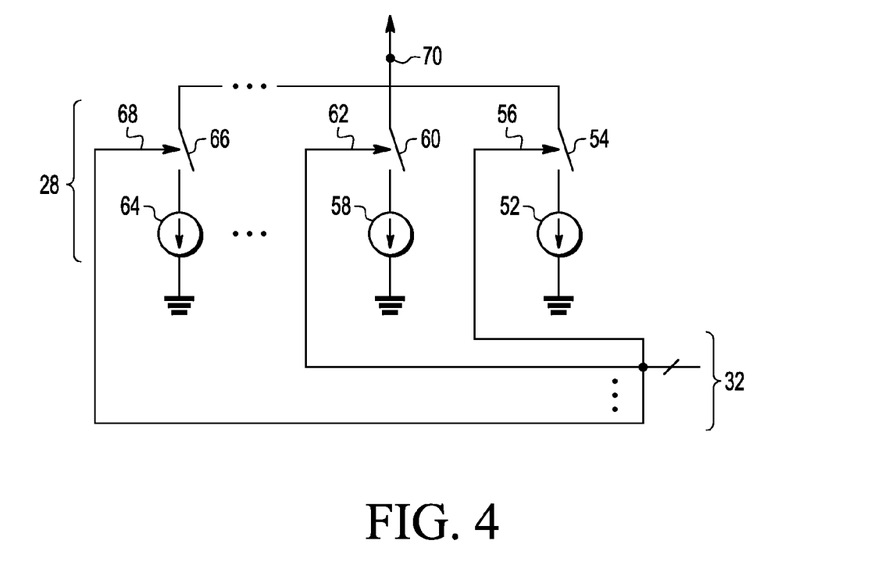

FIG. 3 illustrates an example additive variable current source 26 and FIG. 4 illustrates an example subtractive variable current source 28 that are utilized in variable IVAR current source 25. Additive variable current source 26 includes one or more additive current sources and subtractive variable current source 28 includes one or more subtractive current sources. The number of subtractive current sources implemented in sensing system 16 matches the number of additive current sources implemented, but is not limited thereto. The one or more additive and subtractive current sources are controlled by the enable signals 32, also referred to as an enable signal bus 32. As discussed above, N is an interger that is one or greater and the number of additive current sources and the number of subtractive current sources implemented in sensing system 16 correspond to N (e.g., N additive current sources and N subtractive current sources are implemented).

In some embodiments, enable signal bus 32 provides a distinct enable signal to a respective pair of an additive and subtractive current source, where enable signal bus 32 includes at least N signals. For example, if N=3, enable signal bus 32 includes 3 signals, one distinct signal to each of the 3 current source pairs, which includes an additive current source providing some positive amount of current and a subtractive current source providing a negative version of the same numerical amount of current. The enable signal will turn on either the additive or the subtractive current source (e.g., the additive current source receives an enable signal and the subtractive current source receives an inverted version of the enable signal). In some embodiments, the additive and subtractive current sources are in a standby mode and do not output current until the enable signal is received at the additive and subtractive current sources.

In other embodiments, a distinct enable signal is provided to each additive and subtractive current source, where enable signal bus 32 instead includes 2N signals. In still other embodiments, two enable signal buses 32 are implemented (not shown). For example, if N=3, enable signal bus 32 includes 6 signals, one distinct signal to each of the 3 additive and 3 subtractive current sources. In such an embodiment, each additive and subtractive current source can be separately turned on or off (e.g., enabled or disabled).

FIG. 3 illustrates one embodiment where additive variable current source 26 includes at least additive current sources 34, 40, and 46. A first terminal of current source 34 is connected to node 70 via switch 36, a first terminal of current source 40 is connected to node 70 via switch 42, and a first terminal of current source 46 is connected to node 70 via switch 48. A second terminal of current source 34, a second terminal of current source 40, and a second terminal of current source 46 are connected to the negative power supply terminal (which is illustrated with a ground circuit symbol). A control terminal of switch 36 is connected to a first enable signal 38 of enable signal bus 32, a control terminal of switch 42 is connected to a second enable signal 44 of enable signal bus 32, and a control terminal of switch 48 is connected to a third enable signal 50 of enable signal bus 32. Enable signal bus 32 is received from calibration circuit 20, which is further discussed below in connection with FIG. 5.

FIG. 4 illustrates one embodiment where subtractive current source 28 includes at least subtractive current sources 52, 58, and 64. A first terminal of current source 52 is connected to node 70 via switch 54, a first terminal of current source 58 is connected to node 70 via switch 60, and a first terminal of current source 64 is connected to node 70 via switch 66. A second terminal of current source 34, a second terminal of current source 58, and a second terminal of current source 64 are connected to the negative power supply terminal (which is illustrated with a ground circuit symbol). A control terminal of switch 54 is connected to a first enable signal 56 of enable signal bus 32, a control terminal of switch 60 is connected to a second enable signal 62 of enable signal bus 32, and a control terminal of switch 66 is connected to a third enable signal 68 of enable signal bus 32. In some embodiments, enable signal 56 and enable signal 38 are the same enable signal, enable signals 62 and 44 are the same enable signal, and enable signals 68 and 50 are the same enable signal. In other embodiments, enable signals 56, 62, and 68 for the subtractive current sources are distinct from enable signals 38, 44, and 50 for the additive current sources. Enable signal bus 32 is received from calibration circuit 20, which is further discussed below in connection with FIG. 5.

The amount of current provided by each additive and subtractive current source is dependent upon the size of the (globally) largest negative and positive current offset determined from the plurality of current offsets measured for each of the plurality of DCS circuits 22 in sensing system 16. The largest positive and negative current offsets may be the same numerical value (e.g., ±5 uA) or different numerical values (e.g., +4 uA, −6 uA). In some embodiments, the largest negative and positive current offsets are determined using a statistical average in order to avoid any outliers being used as the largest current offset. For example, a statistical average of the negative current offsets determined for the plurality of DCS circuits 22 may be found to lie at −4 uA, which is determined to be the largest negative current offset, while a statistical average of the positive current offsets is found at 6 uA, which is determined to be the largest positive current offset. In other embodiments, the largest negative and positive current offsets are determined using the absolute value of the negative and positive current offsets determined for the plurality of DCS circuits 22. For example, a positive current offset may be 6 uA and a negative current offset may be −4 uA, where the largest negative and positive current offset is determined to be ±6 uA (since |6 uA| is greater than |−4 uA|).

The additive current sources are globally set to cumulatively provide enough additive current that compensates for (or negates) at least a portion (up to the entirety) of the largest negative and positive current offset found in the plurality of DCS circuits 22. The amount of current provided by the additive and subtractive current sources is configured to increase in a controlled manner. The negative or positive current offset is gradually and precisely minimized by successively enabling each of the one or more additive and subtractive current sources during calibration mode (as further discussed below in connection with FIG. 5).

In some embodiments, the one or more additive and subtractive current sources each provide a same numerical amount of current such that the magnitude of the total additive current or total subtractive current provided at node 70 is increased in a constant stepwise manner. In one example, the amount of current provided by each additive current source is 1 uA, where the magnitude of the additive current at node 70 is increased by 1 uA by current source 34, by another 1 uA by current source 40, and by another 1 uA by current source 46, providing a total additive current at node 70 of 3 uA. Similarly, the amount of current provided by each subtractive current source is −1 uA, where the magnitude of the subtractive current at node 70 is increased by −1 uA by current source 52, by another −1 uA by current source 58, and by another −1 uA by current source 64, providing a total subtractive current at node 70 of −3 uA.

In other embodiments, the one or more additive and subtractive current sources each provide a different numerical amount of current such that the magnitude of the total additive current or total subtractive current provided at node 70 is increased in a diminishing stepwise manner. Such a scheme may also be referred to as successive approximation to find an appropriate IVAR current that compensates an unknown (local) current offset. In one example, the amount of current provided by each additive current source diminishes by a factor of ½ at each additive current source, where the magnitude of additive current at node 70 is increased by 3 uA by current source 34, by 1.5 uA by current source 40, and by 0.75 uA by current source 46, providing a total additive current at node 70 of 5.25 uA. Similarly, the amount of current provided by each subtractive current source is diminished by a factor of ½, where the magnitude of subtractive current at node 70 is increased by −3 uA by current source 52, by −1.5 uA by current source 58, and by −0.75 uA by current source 64, providing a total subtractive current at node 70 of −5.25 uA. Other factors can also be used for the diminishing stepwise manner. In this manner, a first selected IVAR provided by a first subtractive or additive current source negates or reduces half of the current offset in one-bit trim mode, a second selected IVAR provided by a second subtractive or additive current source negates or reduces a quarter (or ½ of ½) of the current offset in two-bit trim mode, and so on.

Figure 5:
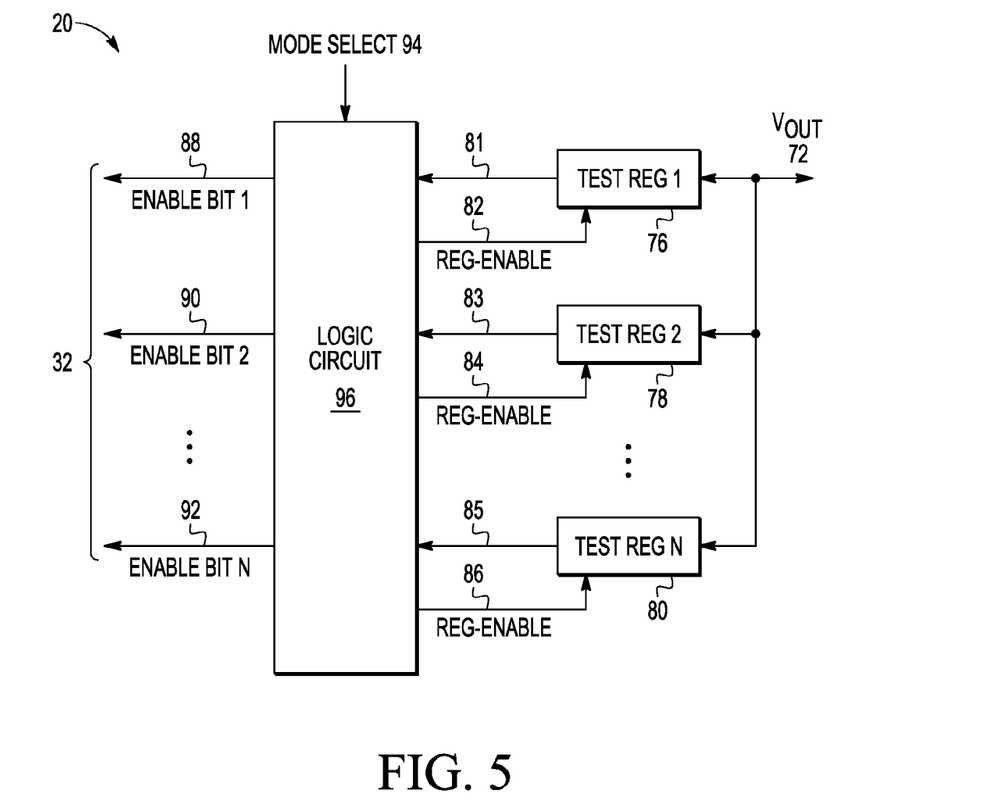
FIG. 5 illustrates a block diagram depicting an example calibration circuit in which the present disclosure is implemented, according to some embodiments.

FIG. 5 illustrates a block diagram depicting an example calibration circuit 20. Calibration circuit 20 includes logic circuit 96 and an N number of test registers. In some embodiments, each of the N test registers corresponds to one signal of enable signal bus 32, where logic circuit 96 outputs N enable signals. In other embodiments, each of the N test registers corresponds to two signals of enable signal bus 32, one distinct signal to each additive and subtractive current source, where logic circuit 96 outputs 2N enable signals (not shown). Logic circuit 96 is configured to receive a bit mode select value 94 (or simply mode select 94) that indicates the number of iterations (or the requested bit trim mode) to be performed, which is in the range of one through N (inclusive). Logic circuit 96 is configured to output enable signal bus 32 based on values, or test results, read from the N test registers.

In the embodiment shown, calibration circuit 20 includes at least 3 test registers (test register 76, test register 78, and test register 80) and logic circuit 96 outputs at least 3 enable signals of enable signal bus 32 (enable signal 88, enable signal 90, and enable signal 92). Each test register has an input terminal that is connected to the output VOUT 72 of DCS circuit 22 and an output terminal that is connected to the logic circuit 96. Each test register is configured to receive a register enable signal from logic circuit 96.

During calibration mode, logic circuit 96 is configured to successively iterate through the bit trim modes until the requested bit trim mode that is specified by mode select 94 is performed. It is noted that logic circuit 96 may include a programmable register that stores an iteration counter that is used to keep track of the iterations as logic circuit progresses toward the requested bit trim mode specified by mode select value 94. During one-bit trim mode (or first iteration), logic circuit 96 enables a first test register 76 using register enable 82. Also at this time, control logic enables DCS circuit to perform a read operation of the current values applied at the first and second input terminals of the DCS circuit, where DCS circuit then outputs VOUT 72 in response to the comparison. Once enabled, test register 76 stores the output VOUT 72 received from DCS circuit 22 as a test result. The other test registers also receive VOUT 72 at this time, but they do not store VOUT 72 since the other test registers are not enabled.

Logic circuit 96 reads the test result stored in test register 76 and selects a first IVAR current value based on the test result by outputting a first enable signal 88 in response to the test result value. The first enable signal controls one of the subtractive and additive current sources to output the selected IVAR current that compensates for the (local) current offset, where the selected IVAR current may be a subtractive current, an additive current, or zero current. For example, if the test result indicates a high logic state (which indicates the DCS circuit has an early trip point due to some negative current offset), logic circuit 96 outputs an enable signal that enables a first subtractive current source. If the test result indicates a low logic state (which indicates the DCS circuit has a late trip point due to some positive current offset), logic circuit 96 outputs an enable signal that enables a first additive current source. In some embodiments, logic circuit 96 outputs a single enable signal that controls both the first subtractive and first additive current source (e.g., the first additive current source receives an enable signal and the first subtractive current source receives an inverted version of the enable signal). In other embodiments, logic circuit 96 outputs two enable signals, one to control the first subtractive current source and one to control the first additive current source.

During a next bit trim mode (or next iteration, such as a second iteration or subsequent iteration), logic circuit 96 enables another test register (e.g., register 78) using the corresponding register enable (e.g., reg-enable 84). DCS circuit 22 reads the current values at the first and second input terminals of the DCS circuit after the first input terminal also receives the IVAR current selected in the previous iteration. In response, DCS circuit 22 outputs VOUT 72, which is stored by the present test register as a test result (e.g., second or subsequent test result). Logic circuit 96 reads the test result and selects a present IVAR current value based on the test result by outputting another enable signal that controls one of another subtractive current source and another additive current source to output the selected IVAR current. Logic circuit 96 continues to perform subsequent iterations as specified by mode select 94.

In some embodiments, logic circuit 96 completes the total number of iterations specified by mode select 94. In other embodiments, logic circuit 96 completes a number of iteration less than the total number of iterations specified by mode select 94. In such embodiments, logic circuit 96 is further configured to compare the present test result with the previous test result (e.g., compare the value stored in the second test register with the value stored in the first test register). If the values are the same, the iteration continues as described above (e.g., logic circuit 22 then controls IVAR source to output a selected IVAR current based on the next test result). If the values are different, then the output of DCS circuit 22 has flipped (e.g., from a high logic state to a low logic state, or from a low logic state to a high logic state), indicating that the amount of selected IVAR current applied at DCS circuit 22 has overcome the (local) current offset. In response to the flipped output, logic circuit 96 determines that DCS circuit does not need any additional calibration in response to the DCS circuit's flipped output and ends the calibration mode (for the local DCS circuit). Logic circuit 96 selects zero current (e.g., disables both additive and subtractive IVAR current sources) and updates the iteration counter to be equal to the value of mode select 94, indicating all iterations are complete. This is to avoid overcompensating the DCS circuit, which is detrimental to the sensing precision of the DCS circuit.

In other embodiments, logic circuit 96 selects a final subtractive or additive IVAR current in response to the DCS circuit's flipped output that reduces the overcompensating current introduced to the DCS circuit (e.g., if additive IVAR current has been previously introduced, the final selected IVAR current may be subtractive; and if subtractive IVAR current has been previously introduced, the final selected IVAR current may be additive). Logic circuit 96 also ends the calibration mode (e.g., setting iteration counter to be equal to the value of mode select 94).

The enabled test registers continue to store the test results after calibration mode is complete, which also causes logic circuit 96 to continue to output the enable signals that control the subtractive and additive current sources to output the total selected IVAR current. During sensing (or read) mode, the total selected IVAR current is provided to DCS circuit to continue compensating for the (local) current offset.

Figure 6:
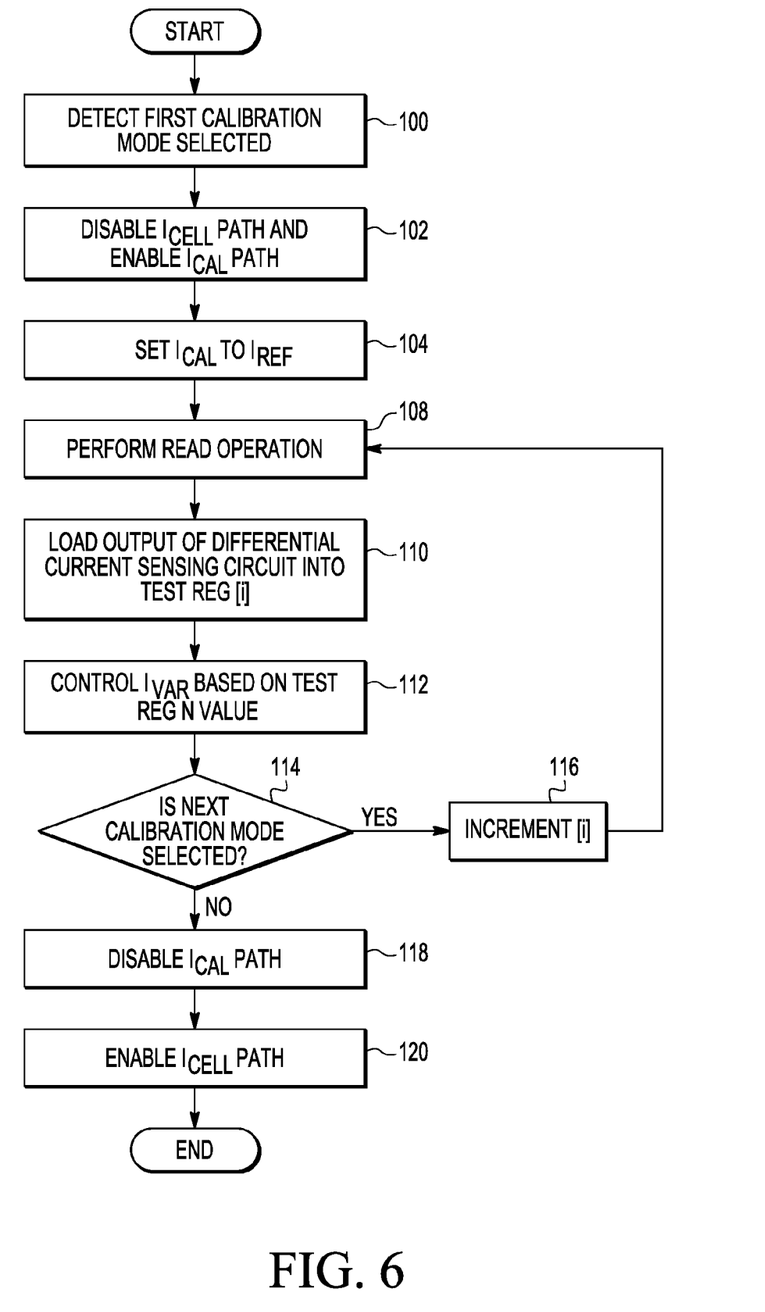
FIG. 6 illustrates a flowchart depicting an example multibit calibration process implemented by a sensing system in which the present disclosure is implemented, according to some embodiments.

FIG. 6 illustrates a flowchart depicting an example multibit calibration process implemented by sensing system 16. The process is performed in parallel by each of the plurality of sense amplifier circuits 18 and calibration circuits 20 in sensing system 16. The process(es) are triggered in response to expiration of some recurring period of time, at start-up of the sensing system 16, or on an as-needed basis. For a given sense amplifier circuit and calibration circuit, the process begins at operation 100, where a logic circuit of the calibration circuit detects that a bit mode select value is received and determines that the mode select value indicates which bit trim mode is selected (or indicates the number of iterations to be performed). Since the bit mode select value is a value in the range of one through N, logic circuit detects that the first calibration mode (or one-bit trim mode) is selected.

The process continues to operation 102, where control logic of the sensing system 16 (not shown) disables the ICELL path (e.g., switch 29 is opened) and enables the ICAL path (e.g., switch 31 is closed). The process continues to operation 104, when the value of ICAL is set to the value of IREF, such as by control logic enabling ICAL to begin outputting a pre-set current value that is the same current value set for IREF. The process continues to operation 108, where a DCS circuit of the sense amplifier circuit performs a read operation, where the two same currents are applied to the two inputs of DCS circuit. In response to the read operation, DCS circuit provides an output. The process continues to operation 110, where logic circuit enables a corresponding test register and the output of DCS circuit is loaded into the test register (e.g., a first test register for a first iteration, an ith test register for an ith iteration, where [i] is an iteration counter that counts from one up through the bit mode select value). The process continues to operation 112, where the logic circuit controls IVAR (e.g., selects a first IVAR current) based on the corresponding test register value.

The process continues to operation 114, where the logic circuit determines if the next bit trim calibration mode is selected. For example, the logic circuit compares the iteration counter [i] to the bit mode select value. If the iteration counter equals the bit mode select value (indicating the total number of requested iterations has been performed), the next calibration mode is not selected, and the process continues to operation 118, where control logic disables ICAL path (e.g., switch 31 is opened). The process continues to operation 120, where control logic enables ICELL path (e.g., switch 29 is closed), and the process (and calibration mode) then ends.

Returning to operation 114, if the iteration counter is less than the bit mode select value (indicating the total number of requested iterations has not been performed), then the next calibration mode is determined to be selected and the process continues to operation 116, where counter [i] is incremented. The process then returns to operation 108, where DCS circuit performs a subsequent read operation since IVAR (which was selected in the previous iteration) is now introduced at the first input of the DCS circuit. The process continues as discussed above.

Although not shown, it is noted that in some embodiments logic circuit also compares the value loaded in present test register [i] in operation 110 with the value stored in the previous test register [i−1]. If the values are the same, such an embodiment continues to operation 112 and the process continues as discussed above. If the values are different (indicating the output of DCS circuit logic has flipped), the process continues to a modified operation 112 where logic circuit controls IVAR (e.g., selects an ith IVAR current) based on the comparison of values of test registers [i] and [i−1], which may be a zero current or an opposite type of current (e.g., an additive current if the previous IVAR current is negative, or a negative current if the previous IVAR current is positive). Also during this modified operation 112, logic circuit updates the iteration counter to be equal to the bit mode select value in order to end calibration mode in operation 114.

Figure 7:
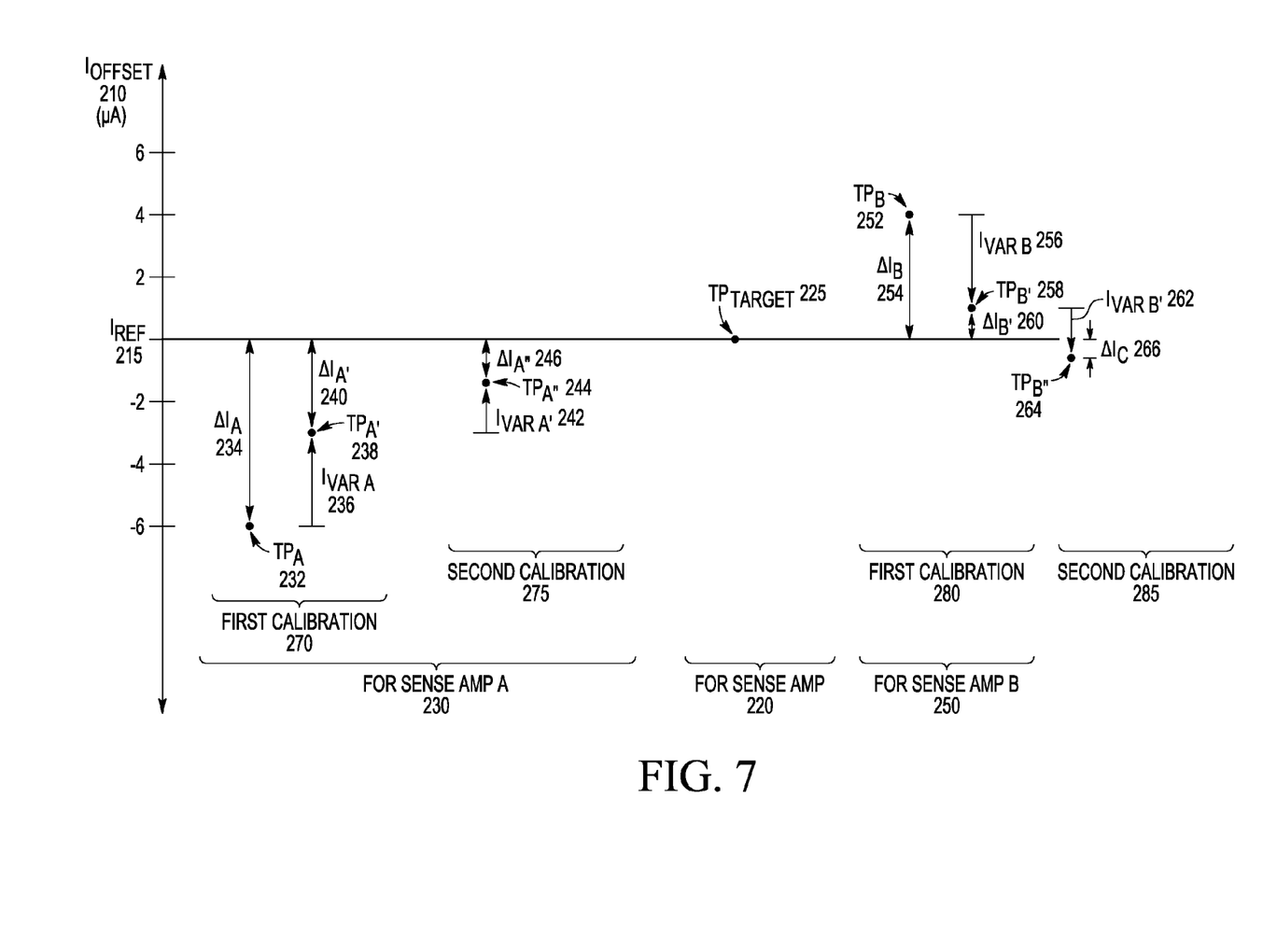
FIG. 7 illustrates a plot diagram depicting example trip point calibrations, according to some embodiments.

FIG. 7 illustrates a plot diagram depicting example trip point calibrations for various sense amplifier circuits (which each include a DCS circuit) during a calibration mode. Example values of current offsets are shown (in uA), but the disclosure is not limited thereto. Each sense amplifier circuit (also referred to as a sense amp) receives a same ICAL applied value and a same IREF applied value, where the ICAL applied value is equal to the IREF applied value. The trip points of three different sense amps are illustrated on the plot diagram. A target trip point 225 is illustrated for a sense amplifier circuit 220 in the center of the plot diagram. TP target 225 is shown as occurring at IREF 215, indicating that there is no current offset that requires further compensation (e.g., current that passes through the first branch of DCS circuit matches the current passed through the second branch of DCS circuit). For discussion purposes, sense amp 220 serves as a target sense amp for comparison with other sense amps.

Trip point A (TPA) 232 is illustrated for sense amplifier circuit A 230 (or sense amp A) on the left side of the plot diagram. TPA 232 is skewed from IREF by a negative current offset $\Delta IA$ 234. A first selected negative current IVAR A 236 is introduced during a first calibration 270 of sense amp A, which reduces the negative current offset to $\Delta IA'$ 240, which in turn effectively moves the trip point of sense amp A to TPA' 238 that is closer to IREF. In the embodiment shown, the magnitude of $\Delta IA$ 234 is used as the largest negative and positive current offset. In other words, $\Delta IA$ 234 is the largest negative current offset and $|\Delta IA|$ 234 is the largest positive current offset. Also in the embodiment shown, IVAR A 236 is half of the negative current offset $\Delta IA$ 234. A second (or subsequent) selected subtractive current IVAR A' 242 is also introduced during a second (or subsequent) calibration 275 of sense amp A, which further reduces the negative current offset to ΔIA" 246, which in turn effectively moves the trip point of sense amp A to TPA" 244 that is closer to IREF. In the embodiment shown, IVAR A' 242 is a quarter of the negative current offset ΔIA 234.

Trip point B (TPB) is illustrated for sense amplifier circuit B 250 (or sense amp B) on the right side of the plot diagram. TPB 252 is skewed from IREF by a positive current offset ΔIB 254. A selected additive current IVAR B 256 is introduced during a first calibration 280 of sense amp B, which reduces the positive current offset to ΔIB' 260, which in turn effectively moves the trip point of sense amp B to TPB' 258 that is closer to IREF. In the embodiment shown, the magnitude of positive current offset ΔIB 254 is less than the largest positive current offset of |ΔIA 234|. Also in the embodiment shown, IVAR B 256 is half of the largest positive current offset |ΔIA 234|. A second (or subsequent) selected additive current IVAR B' 262 is also introduced during a second (or subsequent) calibration 285 of sense amp B. In the embodiment shown, IVAR B' 262 is a quarter of the largest positive current offset |ΔIA 234|. While the positive current offset ΔIB has been eliminated, the introduction of additive IVAR B' 262 effectively causes a negative current offset ΔIC 266, which in turn effectively moves the trip point of sense amp B to TPB" 264. Although moved trip point TPB" 264 has moved "past" IREF 215, the sensing precision of sense amp B is still greatly improved over the original trip point TPB due to multibit calibration.

The distribution of the original trip points of the sense amps is a Gaussian or bell curve plot with a maximum centered around IREF, with tail regions reaching out to the largest positive/negative trip point. As the trip points are calibrated to become closer to IREF (or as the current offset is reduced), the tail regions of the bell curve will move to the center, improving the overall distribution to be more closely centered around IREF. In other words, an original distribution may include trip points that fall within a range of a largest current offset around IREF (e.g., IREF±6 uA), while multibit calibration redistributes those trip points to fall within a narrowed range of a reduced current offset around IREF (e.g., IREF±3 uA). For example, if one-bit trim mode were set to introduce a first IVAR that is half of the largest current offset, then one-bit trim mode would remove half of the distribution tail. If two-bit trim mode were set to introduce a second IVAR that is a quarter of the largest current offset, then two-bit trim mode would remove three-quarters (or ½+¼) of the distribution tail, and so on. Additionally, although trip point TPB" 264 has moved past IREF 215, TPB" still falls within an improved distribution of sense amp trip points.

Figure 8:
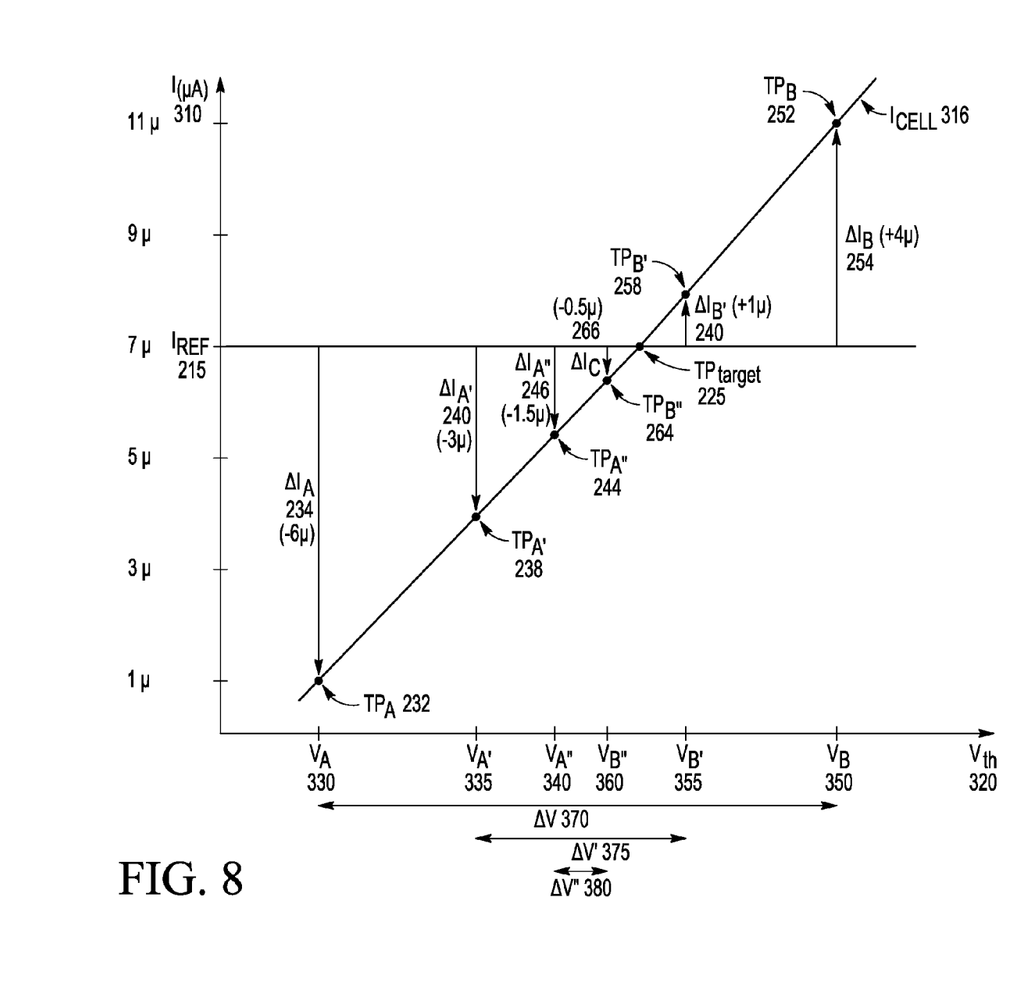
FIGS. 8 and 9 illustrate plot diagrams depicting example memory cell current-voltage curves read by sensing amplifier circuits after multibit calibration, according to some embodiments.

FIG. 8 illustrates a plot diagram depicting an example memory cell current-voltage curve read by sensing amplifier circuits (during sensing mode) before and after calibration. Example values of current 310 are shown (in uA), but the disclosure is not limited thereto. The IVAR current that was selected during calibration mode is applied to the respective sense amp during sensing mode, where the IVAR current continues to reduce the current offset while ICELL is being read by the sense amps. All trip points of the sense amps are illustrated as dots along ICELL current curve 316. The trip point of target sense amp 220 is illustrated as target TP 225 at IREF 215, where sense amp 220 does not have a current offset that requires further compensation (as discussed in connection with FIG. 7).

ICELL 316 is read by sense amp A 230, which is affected by a negative current offset ΔIA 234 (e.g., −6 uA). Continuing the embodiment discussed in connection with FIG. 7, the magnitude of ΔIA 234 is used as the largest negative and positive current offset. In other words, ΔIA 234 is the largest negative current offset and |ΔIA 234| is the largest positive current offset. Sense amp A has an original (early) trip point TPA 232 (e.g., 1 uA) due to ΔIA 234, which is illustrated on the left side of the plot diagram. Once subtractive IVAR A is introduced to the input terminal of sense amp A, ΔIA 234 is reduced to ΔIA' 240 (e.g., −3 uA), which adjusts sense amp A's trip point to be closer to IREF (e.g., 7 uA), shown as TPA' 238 (e.g., 4 uA). In the embodiment shown, the magnitude of ΔIA 234 is reduced by half to ΔIA' 240. Once subtractive IVAR A' is introduced to the input terminal of sense amp A, ΔIA' 240 is further reduced to ΔIA" 246 (e.g., −1.5 uA), which further adjusts sense amp A's trip point to be closer to IREF, shown as TPA" 244 (e.g., 5.5 uA). In the embodiment shown, the magnitude of ΔIA' 240 is reduced by half to ΔIA" 246.

ICELL 316 is also read by sense amp B 250, which is affected by a positive current offset ΔIB 254 (e.g., +4 uA). Continuing the embodiment discussed in connection with FIG. 7, the magnitude of positive current offset ΔIB 254 is less than the largest positive current offset of |ΔIA 234|. Sense amp B has an original (late) trip point TPB 252 (e.g., 11 uA) due to ΔIB 254, which is illustrated on the right side of the plot diagram. Once additive IVAR B is introduced to the input terminal of sense amp B, ΔIB 254 is reduced to ΔIB' 260 (e.g., +1 uA). In the embodiment shown, the magnitude of ΔIB 254 is reduced by more than half to ΔIB' 260. Once additive IVAR B' is introduced to the input terminal of sense amp B, ΔIB' 260 is further reduced to zero, but IVAR B' also overcompensates for the positive current offset that affects sense amp B and causes a new negative current offset ΔIC 266 (e.g., −0.5 uA) that further adjusts sense amp B's trip point to TPB" 264 (e.g., 6.5 uA). Although moved trip point TPB" 264 has moved past IREF 215, the sensing precision of sense amp B is still greatly improved over the original trip point TPB due to multibit calibration.

It is noted that memory cells in the first logic state (e.g., programmed) have higher threshold voltages (or VT), or require application of a higher control gate voltage before ICELL current flows (which generally flows at a low level of current of 4 uA or less). Memory cells in the second logic state (e.g., erased) have lower threshold voltages, or require application of a lower control gate voltage before ICELL current flows (which generally flows at a high level of current of 10 uA or greater). Once the control gate voltage is larger than the threshold voltage required to turn "on" the memory cell, ICELL increases as the control gate voltage increases (in other words, ICELL increases or decreases in proportion to an increase or decrease in applied control gate voltage). Generally, higher threshold voltages are separated from lower threshold voltages (and thus the first logic state is separated from the second logic state) by a threshold voltage window.

During a read operation, a read voltage selected from an operating range of read voltages between the higher and lower threshold voltages (or within the threshold voltage window) is applied to the control gate of the selected memory cell to read ICELL, where the amount of ICELL produced is dependent upon the amount of voltage applied at the control gate. The operating range within the threshold voltage window is separated from the higher and lower threshold voltages by some margin. The margins (on either side of the operating range) are large enough to ensure reliable reads of the memory cells in the first and second logic states. A read voltage is selected from the operating range at a value that is likely to cause as many of the memory cells in the second logic state (e.g., erased) to output enough current to trip (or be greater than) the sense amps' trip points in order to be recognized as erased memory cells, without trigging memory cells in the first logic state (e.g., programmed) to also output enough current to trip the sense amp's trip points.

As illustrated in FIG. 8, a memory cell produces an amount of ICELL equivalent to sense amp A's original trip point TPA 232 when a control gate voltage VA 330 is applied to the memory cell. The memory cell also produces an amount of ICELL equivalent to TPA' 238 when a control gate voltage VA' 335 is applied to the memory cell, and an amount of ICELL equivalent to TPA" 244 when a control gate voltage VA" 340 is applied to the memory cell. In this manner, as the trip point of sense amp A is calibrated to become closer to IREF, a larger control gate voltage needs to be applied at the memory cell in order for the memory cell to output enough current that will trip sense amp A's calibrated trip point TPA" 244.

Similarly, the memory cell produces an amount of ICELL equivalent to sense amp B's original trip point TPB 252 when a control gate voltage VB 350 is applied to the memory cell. The memory cell also produces an amount of ICELL equivalent to TPB' 258 when a control gate voltage VB' 355 is applied to the memory cell, and an amount of ICELL equivalent to TP" 264 when a control gate voltage VB" is applied to the memory cell. In this manner, as the trip point of sense amp B is calibrated to become closer to IREF, a smaller control gate voltage needs to be applied at the memory cell in order for the memory cell to output enough current that will trip sense amp B's calibrated trip point TPB" 264.

As the trip points of the sense amps are calibrated to become closer to IREF, the corresponding control gate voltages (needed to trigger the trip points) converge on a narrowed operating range 380 of possible read voltages. An original operating range 370 is illustrated with voltage VA near a low end of the operating range and voltage VB near the high end of the operating range. An intermediate operating range 375 is illustrated having VA' near a low end of operating range 375 and VB' near a high end of operating range 375). Narrowed operating range 380 is illustrated having VA" near a low end of operating range 380 and VB" near a high end of operating range 380. As the operating range narrows, the margins on either side of the operating range increase, further ensuring reliable reads of the memory cells in the first and second logic states. Selection of a suitable read voltage from one of these operating ranges is further discussed below.

Figure 9:
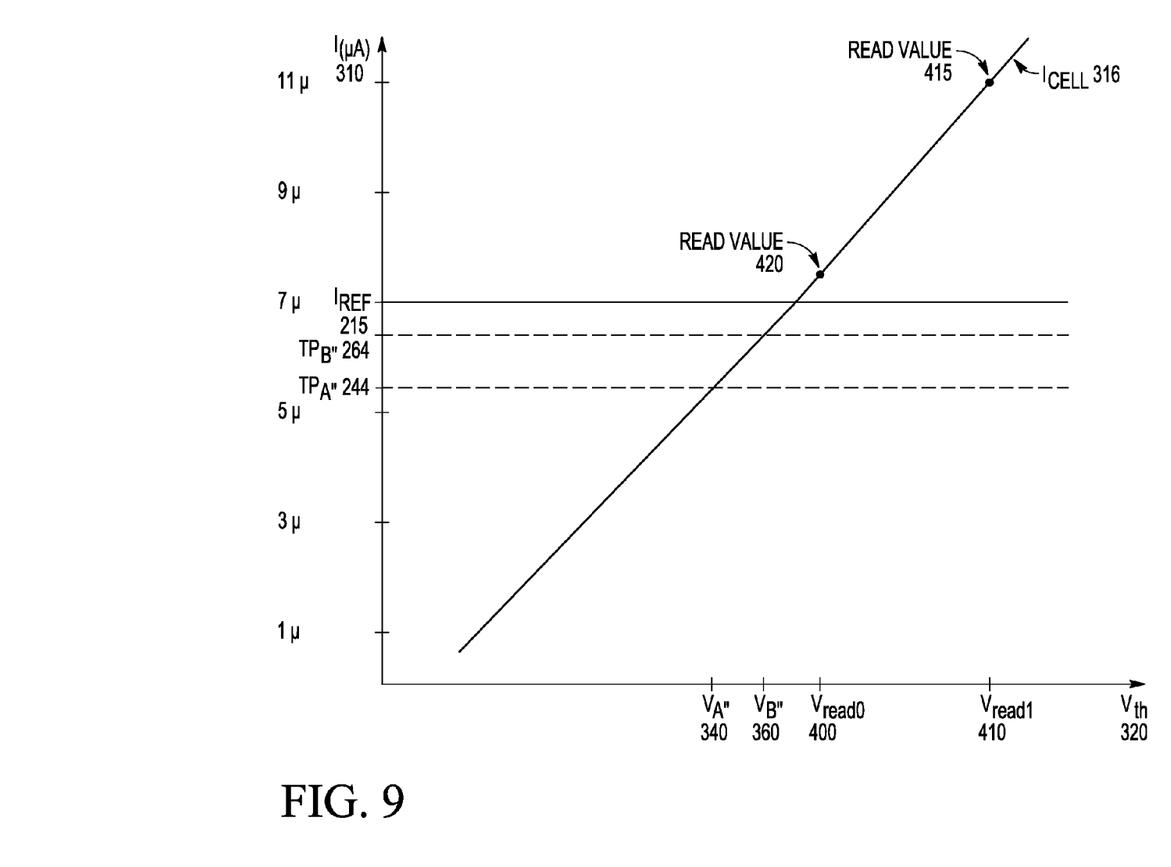

FIG. 9 illustrates a plot diagram depicting an example memory cell current-voltage curve read by sensing amplifier circuits after calibration. In some embodiments, once sense amps have been calibrated, a read voltage Vread 400 is selected from the narrowed operating range 380. Since the read voltage is selected as a value that is likely to cause as many of the memory cells in the second logic state to output enough current to trip the sense amps' calibrated trip points, Vread 400 is selected to cause ICELL 316 to produce enough current value 420 to trip the majority of the sense amps' calibrated trip points (e.g., Vread 400 produces an ICELL value equal to or greater than IREF, or equal to or greater than IREF plus the largest calibrated trip points of the sense amps).

As illustrated, Vread 400 occurs at a value greater than control gate voltages VA" and VB" but less than the original control gate voltage VB (marked as Vread 410 in FIG. 9), which causes the memory cell to produce enough current to trip both TPA" 244 and TPB" 264 and be properly recognized as being in the second logic state (e.g., erased). Exposing the memory cells to a smaller read voltage Vread 400 (as compared to the original voltage VB) improves endurance of the memory cells (e.g., causes less degradation of the memory cells). Further, even if the threshold voltage window is minimized (due to memory cell degradation from continued exposure to program/erase cycles or due to memory cell design choice), multibit calibration ensures the margins are large enough to maintain sensing accuracy of the sense amps. In some embodiments, Vread 400 may be 200 millivolts smaller than VB.

In other embodiments, read access time can be improved due to multibit calibration. Instead of selecting Vread 400, a read voltage Vread 410 is selected, which is the original control gate voltage VB. Since ICELL will output quite a large current (e.g., 11 uA) at such a large control gate voltage, the sense amps will sense the difference between ICELL and IREF much faster due to the difference between ICELL and IREF being much greater at Vread 410 as compared to the difference between ICELL and IREF at Vread 400. In some embodiments, the sense amps' read access time may be improved by 4 nanoseconds.

By now it should be appreciated that there has been provided embodiments of systems, circuits, and methods that provide for multibit calibration to compensate for sensing imprecision of a sense amplifier. In one embodiment of the present disclosure, an integrated circuit is provided, which includes a memory having a plurality of non-volatile memory cells, a calibration circuit, and a sense amplifier coupled to the memory and the calibration circuit. The calibration circuit senses a logic state of a selected memory cell of the plurality of non-volatile memory cells during a sensing mode, the sense amplifier including a differential current sensing circuit having a first input, a second input coupled to a reference current source, and an output coupled to the calibration circuit during a calibration mode; a calibration current source configured to be coupled to the first input of the differential current sensing circuit during the calibration mode and decoupled from the first input during the sensing mode; and a variable current source coupled to the first input of the differential current sensing circuit and to the calibration circuit. The calibration circuit tests a plurality of currents of the variable current source during the calibration mode and selects one of the plurality of currents for use by the differential current sensing circuit; and the sense amplifier uses the selected one of the plurality of currents during the sensing mode.

One aspect of the above embodiment provides that the plurality of currents comprises a first negative current, a first positive current, and no current. A further aspect provides that the selected current is combined with current through the selected memory cell during the sensing mode and with current through the calibration current sensing circuit during the calibration mode. A still further aspect provides that the current through the reference current source and the calibration current source have the same magnitude.

Another aspect of the above embodiment provides that the variable current source includes a positive current source coupled to a positive power supply terminal and a negative current source coupled to a negative power supply terminal. A further aspect provides that the positive current source includes a first plurality of positive current sources of varying magnitudes and the negative current source includes a first plurality of negative current sources of varying magnitudes. A still further aspect provides that the calibration circuit selects, for the variable current source, one of a group consisting of one or more of the first plurality of positive current sources, one or more of the first plurality of negative current sources, and no current source.

Another aspect of the above embodiment provides that the calibration circuit includes a logic block and a plurality of test registers, where a selected test register of the plurality of test registers corresponds to the one of the plurality of currents. A further aspect provides that the variable current source response to an output of the selected test register to provide the one or the plurality of currents.

Another aspect of the above embodiment provides that the first input of the differential current sensing circuit is a non-inverting input from which a first current is drawn by the selected memory cell during the sensing mode, and the one of the plurality of currents is combined with the first current during the sensing mode, the second input is an inverting input from which a second current is drawn by the reference current source.

Another embodiment of the present disclosure provides for a method of sensing a state of a memory cell using a differential current sensing circuit having a first input, a second input, and an output. The method includes forming a calibration current through the first input; forming a reference current through the second input; forming a plurality of test currents through the first input and determining a performance of the differential current sensing circuit for each of the plurality of test currents; selecting a test current from the plurality of test currents; removing the calibration current from the first input; coupling the memory cell to and forming the selected test current through the first input; and reading the output of the differential current sensing circuit to sense the state of the memory cell.

Another aspect of the above embodiment provides that the forming the calibration current includes matching the reference current.

Another aspect of the above embodiment provides that the forming the reference current includes drawing current from the second input. A further aspect provides that the coupling the memory cell to and forming the selected test current through the first input includes drawing a combination of the current through the memory cell and the selected test current from the first input. A still further aspect provides that the drawing the combination of the current through the memory cell and the selected test current results in less current being drawn from the first input than through the memory cell. Another still further aspect provides that the drawing the combination of the current through the memory cell and the selected test current results in more current being drawn from the first input than through the memory cell. Another still further aspect provides that the drawing the combination of the current through the memory cell and the selected test current results in a same amount of current being drawn from the first input than through the memory cell.

Another aspect of the above embodiment provides that the selecting a test current from the plurality of test currents includes storing information identifying the selected test using a test register.

Another embodiment of the present disclosure provides an integrated circuit that includes a memory having a plurality of non-volatile memory cells, a calibration circuit, and a sense amplifier coupled to the memory and the calibration circuit. The sense amplifier senses a logic state of a selected memory cell of the plurality of non-volatile memory cells during a sensing mode and identifies an optimum trim current during a calibration mode. The sense amplifier includes a differential current sensing circuit having a first input, a second input coupled to a reference current source, and an output coupled to the calibration circuit during a calibration mode; a calibration current source matching a magnitude of the reference current source configured to be coupled to the first input of the differential current sensing circuit during the calibration mode and decoupled from the first input during the sensing mode; and a variable current source coupled to the first input of the differential current sensing circuit and to the calibration circuit. The calibration circuit tests a plurality of currents of the variable current source during the calibration mode and selects one of the plurality of currents as the optimum trim current; and the variable current source provides the optimum trim current during the sensing mode.

Another aspect of the above embodiment provides that the optimum trim current supplied by the variable current source provides correction for input offset of the differential current sensing circuit.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   a memory having a plurality of non-volatile memory cells;
   a calibration circuit;
   a sense amplifier coupled to the memory and the calibration circuit that senses a logic state of a selected memory cell of the plurality of non-volatile memory cells during a sensing mode, the sense amplifier comprising;
   a differential current sensing circuit having a first input, a second input coupled to a reference current source, and an output coupled to the calibration circuit during a calibration mode;
   a calibration current source configured to be coupled to the first input of the differential current sensing circuit during the calibration mode and decoupled from the first input during the sensing mode; and
   a variable current source coupled to the first input of the differential current sensing circuit and to the calibration circuit;
   wherein the calibration circuit tests a plurality of currents of the variable current source during the calibration mode and selects one of the plurality of currents for use by the differential current sensing circuit; and
   wherein the sense amplifier uses the selected one of the plurality of currents during the sensing mode.

2. The integrated circuit of claim 1, wherein the plurality of currents comprises a first negative current, a first positive current, and no current.

3. The integrated circuit of claim 2, wherein the selected current is combined with current through the selected memory cell during the sensing mode and with current through a calibration current sensing circuit during the calibration mode.

4. The integrated circuit of claim 3, wherein the current through the reference current source and the calibration current source have the same magnitude.

5. The integrated circuit of claim 1, wherein the variable current source comprises a positive current source coupled to a positive power supply terminal and a negative current source coupled to a negative power supply terminal.

6. The integrated circuit of claim 5, wherein the positive current source comprises a first plurality of positive current sources of varying magnitudes and the negative current source comprises a first plurality of negative current sources of varying magnitudes.

7. The integrated circuit of claim 6, wherein the calibration circuit selects, for the variable current source, one of a group consisting of one or more of the first plurality of positive current sources, one or more of the first plurality of negative current sources, and no current source.

8. The integrated circuit of claim 1, wherein the calibration circuit comprises a logic block and a plurality of test registers, wherein a selected test register of the plurality of test registers corresponds to the one of the plurality of currents.

9. The integrated circuit of claim 8, wherein the variable current source responds to an output of the selected test register to provide the one of the plurality of currents.

10. The integrated circuit of claim 1, wherein the first input of the differential current sensing circuit is a non-inverting input from which a first current is drawn by the selected memory cell during the sensing mode, and the one of the plurality of currents is combined with the first current during the sensing mode, the second input is an inverting input from which a second current is drawn by the reference current source.

11. A method of sensing a state of a memory cell using a differential current sensing circuit having a first input, a second input, and an output, comprising:
   forming a calibration current through the first input;
   forming a reference current through the second input;
   forming a plurality of test currents through the first input and determining a performance of the differential current sensing circuit for each of the plurality of test currents;
   selecting a test current from the plurality of test currents;
   removing the calibration current from the first input;
   coupling the memory cell to and forming the selected test current through the first input; and
   reading the output of the differential current sensing circuit to sense the state of the memory cell.

12. The method of claim 11, wherein the forming the calibration current comprises matching the reference current.

13. The method of claim 11, wherein the forming the reference current comprises drawing current from the second input.

14. The method of claim 13, wherein the coupling the memory cell to and forming the selected test current through the first input comprises drawing a combination of the current through the memory cell and the selected test current from the first input.

15. The method of claim 14, wherein the drawing the combination of the current through the memory cell and the selected test current results in less current being drawn from the first input than through the memory cell.

16. The method of claim 14, wherein the drawing the combination of the current through the memory cell and the selected test current results in more current being drawn from the first input than through the memory cell.

17. The method of claim 14, wherein the drawing the combination of the current through the memory cell and the selected test current results in a same amount of current being drawn from the first input as through the memory cell.

18. The method of claim 11, wherein the selecting a test current from the plurality of test currents comprises storing information identifying the selected test using a test register.

19. An integrated circuit, comprising:
a memory having a plurality of non-volatile memory cells;
a calibration circuit;
a sense amplifier coupled to the memory and the calibration circuit that senses a logic state of a selected memory cell of the plurality of non-volatile memory cells during a sensing mode and identifies an optimum trim current during a calibration mode, the sense amplifier comprising;
a differential current sensing circuit having a first input, a second input coupled to a reference current source, and an output coupled to the calibration circuit during the calibration mode;
a calibration current source matching a magnitude of the reference current source configured to be coupled to the first input of the differential current sensing circuit during the calibration mode and decoupled from the first input during the sensing mode; and
a variable current source coupled to the first input of the differential current sensing circuit and to the calibration circuit;
wherein the calibration circuit tests a plurality of currents of the variable current source during the calibration mode and selects one of the plurality of currents as the optimum trim current; and
wherein the variable current source provides the optimum trim current during the sensing mode.

20. The integrated circuit of claim 19, wherein the optimum trim current supplied by the variable current source provides correction for input offset of the differential current sensing circuit.

* * * * *